United States Patent [19]
Cerrina et al.

[11] Patent Number: 5,371,774
[45] Date of Patent: Dec. 6, 1994

[54] X-RAY LITHOGRAPHY BEAMLINE IMAGING SYSTEM

[75] Inventors: Franco Cerrina; Jaibei Xiao, both of Madison, Wis.

[73] Assignee: Wisconsin Alumni Research Foundation, Madison, Wis.

[21] Appl. No.: 83,547

[22] Filed: Jun. 24, 1993

[51] Int. Cl.$^5$ .............................................. G21K 5/00
[52] U.S. Cl. ....................................... 378/34; 378/84; 378/145
[58] Field of Search .................... 378/34, 84, 145, 147

[56] References Cited

U.S. PATENT DOCUMENTS

| | | |
|---|---|---|
| 4,028,547 | 6/1977 | Eisenberger. |
| 4,181,839 | 1/1980 | Hatton et al.. |
| 4,242,588 | 12/1980 | Silk et al.. |
| 4,516,254 | 5/1985 | Komeyama et al.. |
| 4,679,221 | 7/1987 | O'Brien et al.. |
| 4,748,646 | 5/1988 | Osada et al.. |
| 4,803,713 | 2/1989 | Fujii. |
| 5,031,199 | 7/1991 | Cole, III et al.. |
| 5,123,036 | 6/1992 | Uno et al. ............................ 378/34 |
| 5,125,014 | 6/1992 | Watanabe et al. ................... 378/34 |
| 5,214,685 | 5/1993 | Howells ............................... 378/34 |

FOREIGN PATENT DOCUMENTS 60-156000 1/1984 Japan.

OTHER PUBLICATIONS

"New Synchrotron Radiation Center beamlines at Aladdin", C. H. Pruett et al., Rev. Sci. Instrum. 60(7), Jul. 1989, pp. 1913–1916.

"The Torus Grating", H. Haber, J. O. S. A., 40(3), Mar. 1950, pp. 153–165.

"Geometric Theory of the Grating", H. Noda et al., J. O. S. A. B 64(8), Aug., 1974, pp. 1031–1036.

*Principles of Optics,* M. Born, E. Wolf, Sixth Edition, "Geometrical Theory of Imaging", pp. 132–141, 196–201, 1980.

*Handbook on Synchrotron Radiation,* vol. 1, edited by E. E. Koch, Chapter 3, "Grating Monochromators And Optics For The VUV And Soft X-Ray Region", R. L. Johnson, pp. 173–260, 1983.

*Shadow,* Ray Tracing Program, Chapter 1, pp. 3–7, 1984.

"The University of Wisconsin X-Ray Lithography Beamline: First Results", B. Lai et al., Nucl. Instrum. Methods A 246, 1986, pp. 681–686.

"High Resolution Lithography Using Synchrotron Radiation", H. Betz, Nucl. Instrum. Methods A 246, 1986, pp. 658–680.

"X-Ray Lithography at the Standford Synchrotron Radiation Laboratory", P. Pianetta et al., Nucl. Instrum. Methods A 246, 1986, pp. 641–643.

"X-Ray Lithography and Storage Rings", J. Warlaumont, Nucl. Instrum. Methods A 246, 1986, pp. 687–694.

Handbook on Synchrotron Radiation, G. V. Marr, vol. 2, Chapter 2, "Optical Engineering", J. B. West et al., pp. 21–120, 1987.

"New Synchrotron Radiation Center beamlines At Aladdin", C. H. Pruett et al., Aug. 29, 1988.

(List continued on next page.)

*Primary Examiner*—David P. Porta
*Attorney, Agent, or Firm*—Andrus, Sceales, Starke & Sawall

[57] ABSTRACT

An X-ray lithography beamline imaging system has a single condenser mirror with an aspherical reflecting surface, with symmetry only about a plane, without axial symmetry. For an X-ray beam emitted along a y axis and diverging along x and z axes, the reflecting surface is asymmetrical about the y axis and has different focusing power in directions along the x and z axes in an imaging plane orthogonal to the y axis and spaced from the mirror along the y axis such that the mirror reflects and focuses the X-ray beam to a point along the y axis in the imaging plane and to a line along the x axis in the imaging plane.

4 Claims, 11 Drawing Sheets

OTHER PUBLICATIONS

"Exposure Instrumentation For The Application of X-Ray Lithography Using Synchrotron Radiation", H. Oertel et al., Rev. Sci. Instrum. 69(7), p. 2140, Jul. 1989.

"Lithography Beamline Design and Exposure Uniformity Controlling and Measuring", S. Qian et al., Rev. Sci. Instrum. 60(7), Jul. 1989, pp. 2148–2149.

"Optimization of a Synchrotron Based X-Ray Lithographic System", E. Bernieri et al., Rev. Sci. Instrum. 60(7), p. 2137, Jul. 1989.

"The Adone Wiggler X-Ray Lithography Beamline", E. Burattini et al., Rev. Sci. Instrum. 60(7), Jul. 1989, pp. 2133–2143.

"Scanning X-ray Stepper For Synchrotron Radiation", E. Cullman et al., Rev. Sci. Instrum. 60(7), Jul. 1989, pp. 2150–2152.

"Beamline Design For Homogeneous Irradiation of Large Exposure Fields Using Synchrotron Radiation", K. Brehm et al., Microelectronics Engineering 9(1989) pp. 143–146.

"A Beamline and Its Components for SR Lithography", Takashi Kaneko et al., Japanese Journal of Applied Physics, vol. 28, No. 10, Oct. 1989, pp. 2080–2083.

"Novel toroidal mirror enchances x-ray lithography beamline at CXrL", R. K. Cole et al., SPIE vol. 1465 Electron–Beam, X-Ray, and Ion–Beam Submicrometer Lithographies for Manufacturing 1991.

"Evaluation of a new VUV/Soft X-Ray Toroidal Grating Monochromator with a Movable Exit Slit", D. C. Mancini et al., Synchroton Radiation Center, University of Wisconsin Madison, Stoughton, Wis. 1991.

"Saddle Toroid Arrays: Novel Grazing Incidences Optics For Synchrotron X-Ray Lithography", R. J. Rosser, Blackett Laboratory, Imperial College, London, England, 1991.

"Grasshopper" Monochromator, Baker Manufacturing Company, Instrument Division, 133 Enterprise Street, Evansville, Wis. 53536, Dec. 1991.

"Performances of CXrl X-ray Beamlines", R. Cole et al., SPIE, Mar. 1992.

X-RAY LITHOGRAPHY BEAMLINE IMAGING SYSTEM

This invention was made with United States Government support awarded by the National Science Foundation (NSF), Grant No. ECS-8921165, and the Naval Research Laboratory (NRL), Grant No. N00014-91-J-1876. The United States Government has certain rights in this invention.

BACKGROUND AND SUMMARY

The invention relates to X-ray systems and X-ray lithography utilizing synchrotron radiation, and more particularly to an X-ray lithography beamline imaging system.

The invention also relates to commonly owned U.S. Pat. No. 5,031,199, incorporated herein by reference.

In the manufacture of microelectronic devices, photolithographic techniques are commonly utilized. To obtain greater resolution in the formation of microstructures than can be obtained with visible light wavelengths, efforts have been made to use shorter wavelength radiation, particularly X-rays. To achieve adequate resolution, for example, 0.25 micron lithography, the beam of X-rays must display high spectral and spatial uniformity at the plane of the wafer being exposed. Synchrotrons are particularly promising X-ray sources for lithography because they provide a very stable and defined source of X-rays. The electrons orbiting inside the vacuum enclosure of the synchrotron emit electromagnetic radiation as they are bent by the magnetic fields used to define the path of travel. This electromagnetic radiation is an unavoidable consequence of changing the direction of travel of the electrons and is typically referred to as synchrotron radiation. The energy that the electrons lose in the form of synchrotron radiation must be regained at some point in their orbit around the ring, or they will spiral in from the desired path and be lost. Orbiting electrons can also be lost through collisions with residual gas atoms and ions within the vacuum chamber. Thus, ultra-high quality vacuums are necessary to obtain satisfactory lifetimes of the stored beam.

Synchrotron radiation is emitted in a continuous spectrum of "light", ranging from radio and infrared wavelengths upwards through the spectrum, without the intense, narrow peaks associated with other sources. The shape of a spectral curve of a representative synchrotron storage ring, the Aladdin ring, is shown in FIG. 1. FIGS. 1–4 and a portion of FIG. 5 of incorporated U.S. Pat. No. 5,031,199 are reproduced herein as FIGS. 1–5, respectively, and use like reference numerals where appropriate to facilitate understanding.

All synchrotrons have similar curves as in FIG. 1 that define their spectra, which vary from one another in intensity and the critical photon energy. The critical photon energy $E_c$ is determined by the radius of curvature of the path of the electrons and their kinetic energy and is given by the relationship:

$$E_c = \frac{3hc}{4\pi R_m} \left( \frac{E_e}{m_e C^2} \right)^3$$

where $R_m$ is the bending radius, $m_e$ is the electron's rest mass, h is Plank's constant, $E_e$ is the energy of the electron beam and c is the speed of light. Half of the total power is radiated above the critical energy and half below. The higher the kinetic energy of the electrons, or the steeper the bend of the orbit, the higher the critical photon energy. By knowing this information, the synchrotron can be designed to match the spectral requirements of the user.

Parameters describing the size of the source of synchrotron radiation and the rate at which it is diverging from the source are also of importance. Since the electrons are the source of synchrotron radiation, the cross section of the electron beam defines the cross section of the source. Within the plane of the orbit the light is emitted in a broad, continuous fan, which is tangent to the path of the electrons, as illustrated in FIG. 2—which shows a section of a synchrotron 20 having an orbiting electron beam 21 and a fan of synchrotron radiation indicated by the arrows 22. FIG. 3 shows the distribution of the flux of the synchrotron radiation at a plane perpendicular to the plane of the ring, with the distribution of flux indicated by the density of the dots shown within the box 25 in FIG. 3. The flux is substantially uniform horizontally, as shown in the graph at 26, and exhibits a Gaussian distribution profile vertically as shown by the graph 27 in FIG. 3.

Because of the relatively small height and width of the electron beam, it acts as a point source of radiation, providing crisp images at an exposure plane which is typically 8 meters or more away from the ring. However, at a distance of 8 meters a 1 inch wide exposure field typically collects only 3.2 milli-radians of the available radiation. There are two ways to improve the power incident at a photo-resist: either shorten the beamline or install focusing elements. The use of focusing elements has the potential advantage of collecting X-rays from a very wide aperture and providing a wide image with a very small vertical height. However, the use of focusing elements results in a loss of power at each element because of low reflectivity of the X-rays and introduces aberrations. To operate within acceptable values of reflectivity and maximize the delivered power, it is necessary to work at grazing angles (i.e., at angles of incidence e from a normal to the surface such that $86° \leq \Theta \leq 89.5°$). Furthermore, because synchrotron radiation is emitted in a horizontal fan, the use of grazing incidence optics is particularly suitable. The small vertical divergence of the synchrotron radiation implies that a wide horizontal mirror can accept a large fan of light at a small grazing angle without being unacceptably long.

The optical system (beamline) must deliver uniform power over the exposure area, typically 2 inches horizontally by 1 inch vertically. This can be achieved by (a) expanding the X-ray beam or (b) scanning the X-ray beam across the image. The first approach is not compatible with vacuum isolation. The present invention is well suited to the second approach, both in the form of mask-wafer scanning and beam rastering.

An X-ray lithography beamline suitable for production purposes should deliver a stable and well characterized flux of X-rays to the exposure field. Desirable characteristics for an X-ray lithography beamline for production purposes include uniform power density over the entire scan region, large collection angle near the source, minimal losses of useful X-rays, a modular optical package with stable, inexpensive recoatable optical elements, and an exposure field measuring at least 1 inch by 1 inch and preferably 2 inches by 2 inches.

Various beamline designs have been proposed for use in X-ray lithography. These include straight-through transmission systems, for example as in B. Lai et al, "University of Wisconsin X-Ray Lithography Beamline: First Results" Nucl. Instrum. Methods A 246, pp. 681 et seq., (1986); H. Oertel et al, "Exposure Instrumentation For the Application of X-Ray Lithography Using Synchrotron Radiation", Rev. Sci. Instrum. 60(7), pp. 2140 et seq., 1989. Other systems have utilized planar optics to provide scanning and filtering capabilities. See, H. Betz, "High Resolution Lithography Using Synchrotron Radiation", Nucl. Instrum. Methods A 246, pp. 659 et seq., 1986; P. Pianetta et al, "X-Ray Lithography and the Stanford Synchrotron Radiation Laboratory", Nucl. Instrum. Methods A 246, pp. 641 et seq., 1986; S. Qian et al, "Lithography Beamline Design and Exposure Uniformity Controlling and Measuring", Rev. Sci. Instrum. 60(7) pp. 2148 et seq., 1989; E. Bernieri et al, "Optimization of a Synchrotron Based X-Ray Lithographic System", Rev. Sci. Instrum. 60(7), pp. 2137 et seq., 1989; U.S. Pat. No. 4,803,713 to K. Fujii entitled "X-Ray Lithography System Using Synchrotron Radiation"; E. Burattini et al, "The Adone Wiggler X-Ray Lithography Beamline", Rev. Sci. Instrum. 60(7), pp. 2133 et seq., 1989. The use of single figured mirrors is proposed in the article by J. Warlaumont, "X-Ray Lithography in Storage Rings", Nucl. Instrum. Methods A 246, pp. 687 et seq., 1986. Other proposed systems include the use of Bragg reflections from crystalline surfaces as described in U.S. Pat. No. 4,028,547 entitled "X-Ray Photolithography" and microfabricated structures as described by R. J. Rosser, "Saddle Toroid Arrays: Novel Grazing Incidences Optics for Synchrotron X-Ray Lithography", Blackett Laboratory, Imperial College, London, England.

In an X-ray lithography system, the X-rays are directed through an X-ray mask and onto the photo-resist in those areas which are not shadowed by the non-transmissive pattern formed on the X-ray mask. Generally, the mask will consist of a thin substrate layer which is overlaid by an X-ray absorbing material in the desired pattern. The transmission of the X-ray mask substrate and the absorption of the photo-resist can be used to define the efficiency of the mask/resist system. Low energy X-rays striking the mask substrate are readily absorbed by the substrate material and never make it to the photo-resist. The energy of these absorbed photons goes into heating the mask, which can lead to undesirable side effects as expansion and distortion of the mask. Very high energy X-rays pass through the mask substrate, the absorber, and the photo-resist with few of the interactions that lead to image formation, reducing the usefulness of these photons. On the other hand, those high energy photons that do interact with the photo-resist may have passed through the absorber or "dark" areas of the pattern on the mask, thus reducing the contrast of the image produced in the resist. The product of the mask transmission and the photoresist absorption defines the system response. Thus, it is preferable that the X-ray flux which reaches the X-ray mask be mainly composed of photons which have an energy which lies in an optimal energy region referred to as the "Process Window". The Process Window will vary depending on the mask substrate and the photo-resist chosen, but in general the Process Window will be in the range of 600 eV to 2000 eV, as illustrated in FIG. 4 for the case of the 2 micron thick polycrystalline silicon mask substrate and a 1 micron thick Novolack photo-resist.

Various beamline designs have been implemented in the prior art, including two and three mirror systems, and a single cylindrical mirror system. The X-ray optics involve simple surfaces such as spherical, cylindrical, elliptical or toroidal. Such surfaces are all symmetrical about an axis. When the requisite imaging does not have a symmetrical property, however, single and symmetric surfaces cannot meet the imaging requirement. Thus, multiple surfaces have been used to correct each others' aberration and deliver required uniformity.

In incorporated U.S. Pat. No. 5,031,199, an X-ray beamline apparatus receives synchrotron radiation X-rays and collects and focuses the beam utilizing two grazing incidence X-ray mirrors which sequentially deflect the beam. The first or entrance mirror is a toroidal mirror which is concave along its length and width. It acts to collect the diverging fan of synchrotron radiation and to collimate partially the X-rays horizontally. The second or refocusing mirror is a concave-convex mirror which is concave in length but convex along its width. The refocusing mirror acts to collimate the light horizontally and to focus the light vertically. The curves of the reflecting surfaces of the two mirrors act in concert to provide a substantially uniform image with uniform power distribution. The two radii of curvatures of the two mirrors, the distance of separation between them, and the inclination angle of the refocusing mirror provide 6 degrees of freedom that can be used to optimize the shape of the image at the exposure field. Parameters of the two mirrors work in concert to produce a better shaped image than either mirror alone. In addition to focusing and collimating the beam, the two mirrors serve to attenuate the high energy photons, e.g., those above approximately 2,200 electron volts (eV). Low energy photons (below 600 eV) are attenuated by a window closing the end of the beamline, preferably formed of beryllium, although a variety of other materials may be used for the window, such as silicon, silicon nitride, silicon carbide and diamond. The beamline system effectively acts as a bandpass filter of photon energies to provide a spectral through-put that closely matches the desired Process Window, resulting in excellent carrier/absorber contrast and good photo-resist response, while simultaneously reducing the heat load on the mask. To obtain scanning of the beam across the image field, a third flat mirror may be interposed in the beamline. This mirror is mounted to pivot slightly about an axis perpendicular to the beam at a low grazing angle of incidence to deflect the beam across the image field as desired. Each of the mirrors is preferably housed within its own self-contained vacuum chamber, with sectioning dual gate valves between these chambers providing the capability of isolating an individual component. Each element of the system can be removed for modification, maintenance or repair without affecting the other elements. Very slight changes in the location and tilt of the two toroidal mirrors can be used to alter the distance to the final image without compromising either the power or the uniformity of the image shape. The resulting beam at the image plane is very sharply defined and substantially uniform in flux across the horizontal width of the beam. Variations in flux across the beam can be compensated, if desired, in various ways, including, but not limited to, profiling the thickness of the exit window to achieve greater attenuation at some areas of the beam than in others, by using variable thickness filters and by using shaped beam apertures.

The present invention provides an X-ray lithography beamline imaging system utilizing a single mirror, and satisfies the imaging requirement with an aspherical reflecting surface. The reflecting surface has symmetry only about a plane, and does not have axial symmetry. The surface function is described by polynomials.

DETAILED DESCRIPTION

Figure 5:
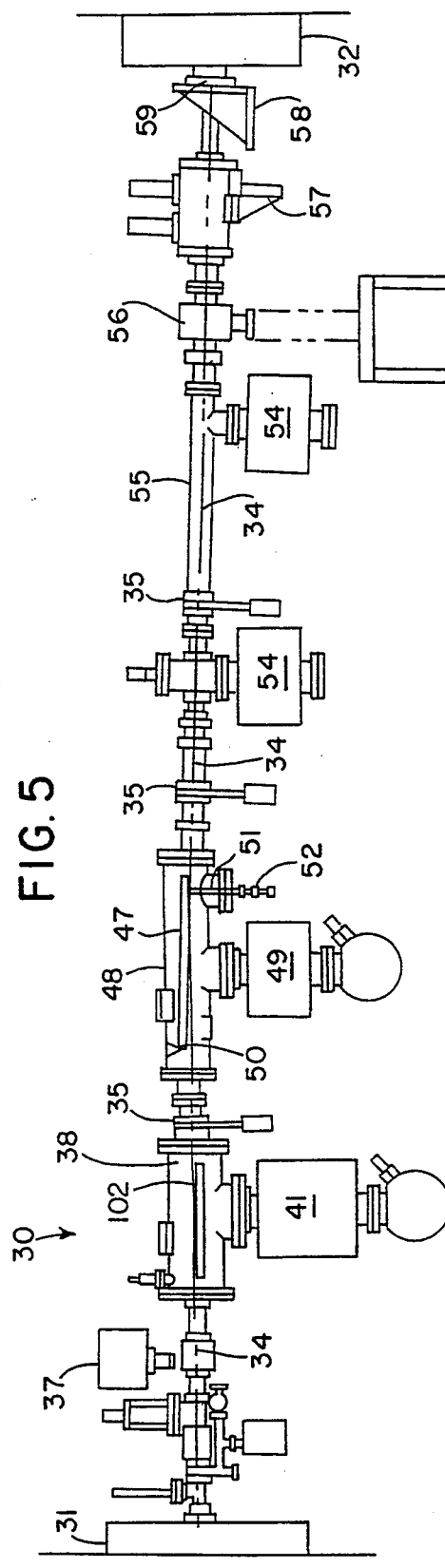
FIG. 5 is a schematic drawing of an X-ray beamline apparatus in accordance with the present invention.

FIG. 5 shows X-ray beamline apparatus in accordance with the present invention, and uses like reference numerals from incorporated U.S. Pat. No. 5,031,199 where appropriate to facilitate understanding. X-ray beamline apparatus 30 receives synchrotron radiation from a synchrotron 31 and delivers an X-ray beam to a target apparatus 32, such as a holder and stepper for mounting semiconductor wafers which are to be exposed by the X-ray beam. The path of the X-ray beam is indicated by the dashed line 34, which path is fully enclosed by enclosing structure, the interior of which is evacuated to a very low pressure. The enclosing mechanical structure for the beamline is preferably constructed to isolate the major components of the system to allow their removal and replacement as modules, and for this purpose gate valves 35 are interposed between the major components.

Figure 6:
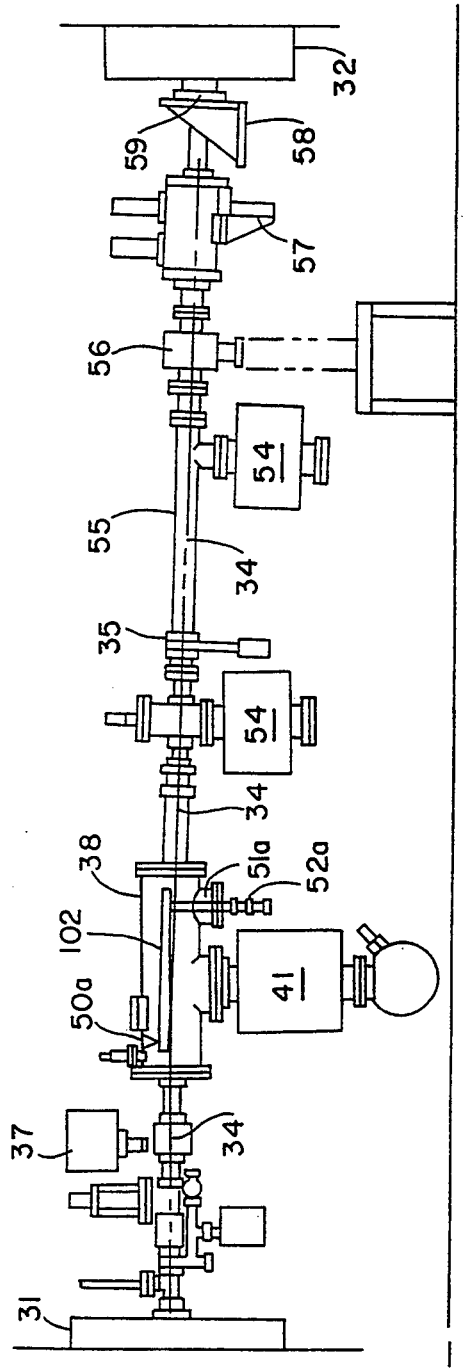
FIG. 6 is like FIG. 5 and shows another embodiment.

The major components include a fast closure valve 37 which is mounted adjacent the synchrotron and is capable of closing rapidly to isolate the synchrotron from any failure of the vacuum in the beamline system. The beam of synchrotron radiation 34 exiting the synchrotron 31 enters mirror enclosure 38 which mounts mirror 102 and is evacuated by a pump 41. The beam 34 is reflected by mirror 102, to be described, to a focused beam which is then intercepted by a flat scanning mirror 47 mounted within a containment structure 48 and evacuated by a pump 49. The flat mirror 47 is mounted to pivot about a pivot point 50 and is driven upwardly and downwardly at its opposite end by a driveshaft 51 and a linear actuator 52. In another embodiment, FIG. 6, scanning mirror 47 is eliminated, and mirror 102 is mounted to pivot about a pivot point 50a and is driven upwardly and downwardly at its opposite end by a drive shaft 51a and a linear actuator 52a. The embodiment of FIG. 6 is preferred because it eliminates a reflection surface (at mirror 47) and the loss inherent therein.

The beam then proceeds down the remaining components of the beam path, which preferably include additional vacuum pumps 54, an acoustic delay line 55, a diagnostic mirror assembly 56, and a shutter assembly 57, finally reaching the mounting assembly 58 for the exit window 59. The window 59 closes the exit of the beamline to seal the interior of the beamline apparatus from the atmosphere so that it may be evacuated down to an ultrahigh vacuum commensurate with that within the synchrotron 31.

Figure 1:
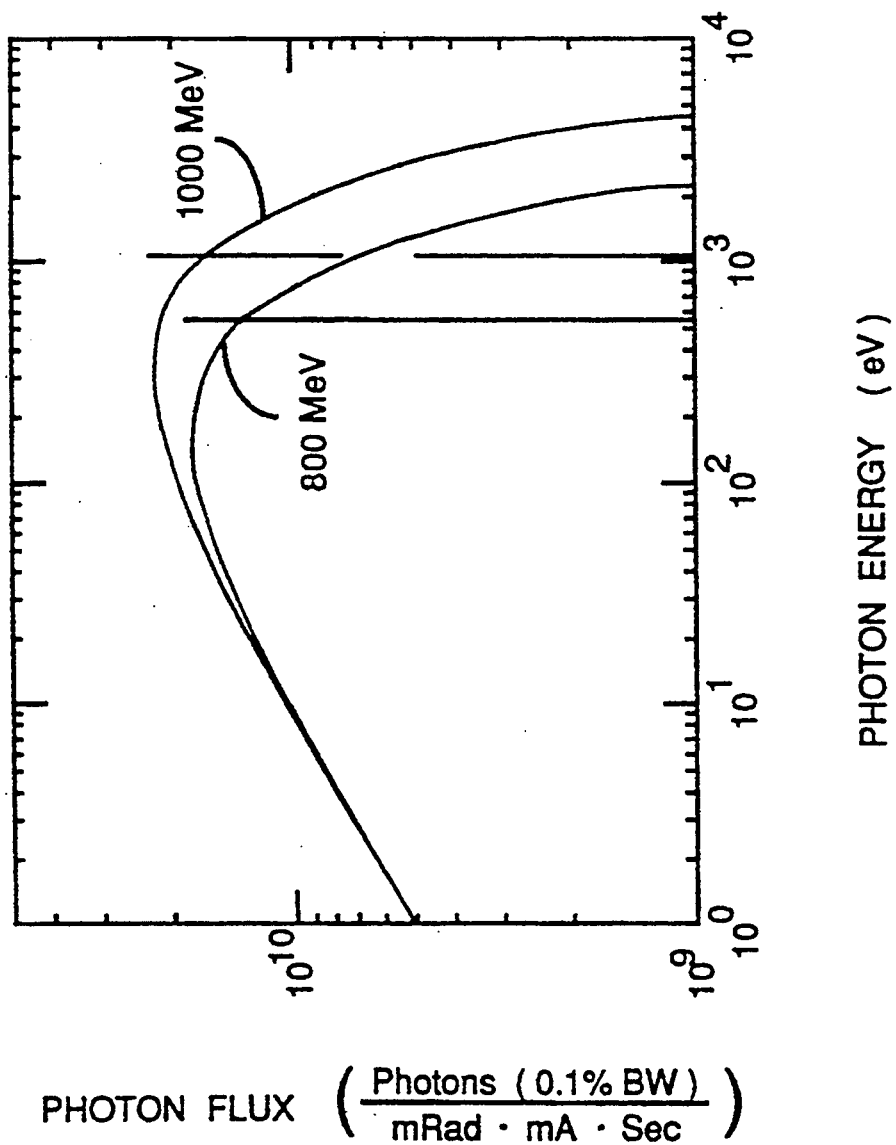
FIG. 1 are plots of spectra of emitted photon energy at two different electron energy levels for a synchrotron storage ring.
Figure 2:
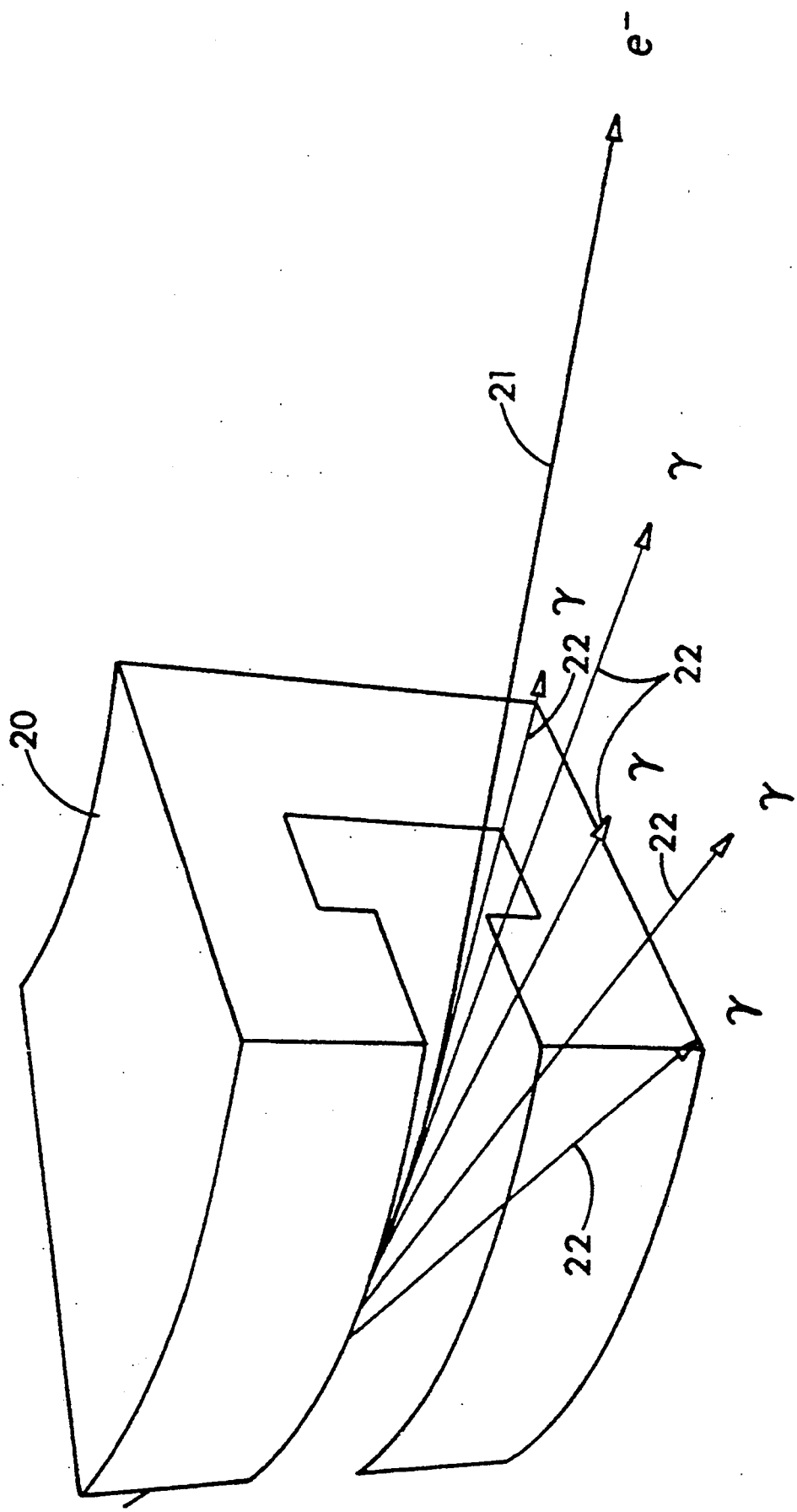
FIG. 2 is an illustrative drawing showing the fan of synchrotron radiation.
Figure 3:
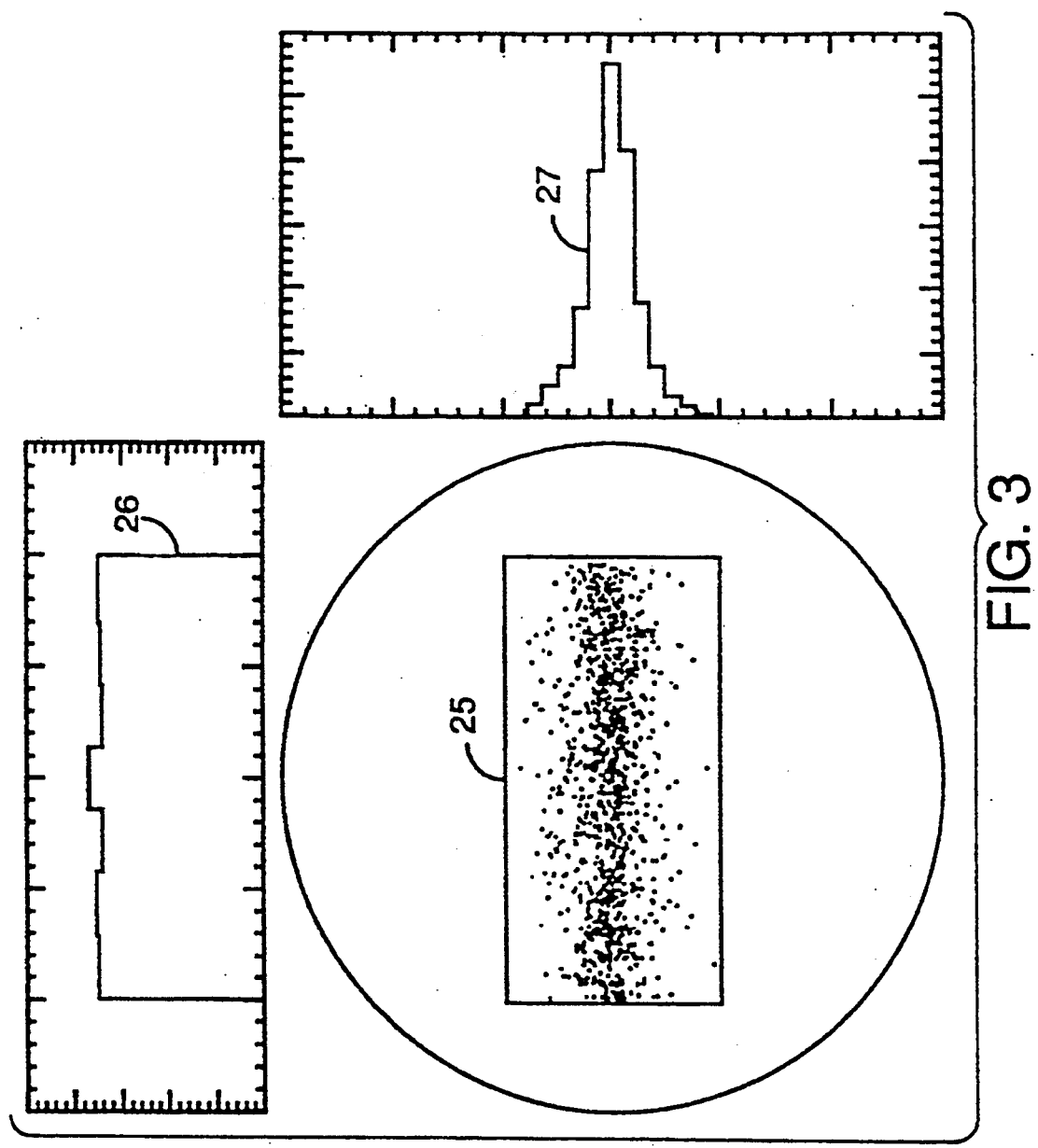
FIG. 3 are illustrative plots showing the vertical and horizontal distribution of X-ray flux in a cross section of the synchrotron radiation beam.
Figure 4:
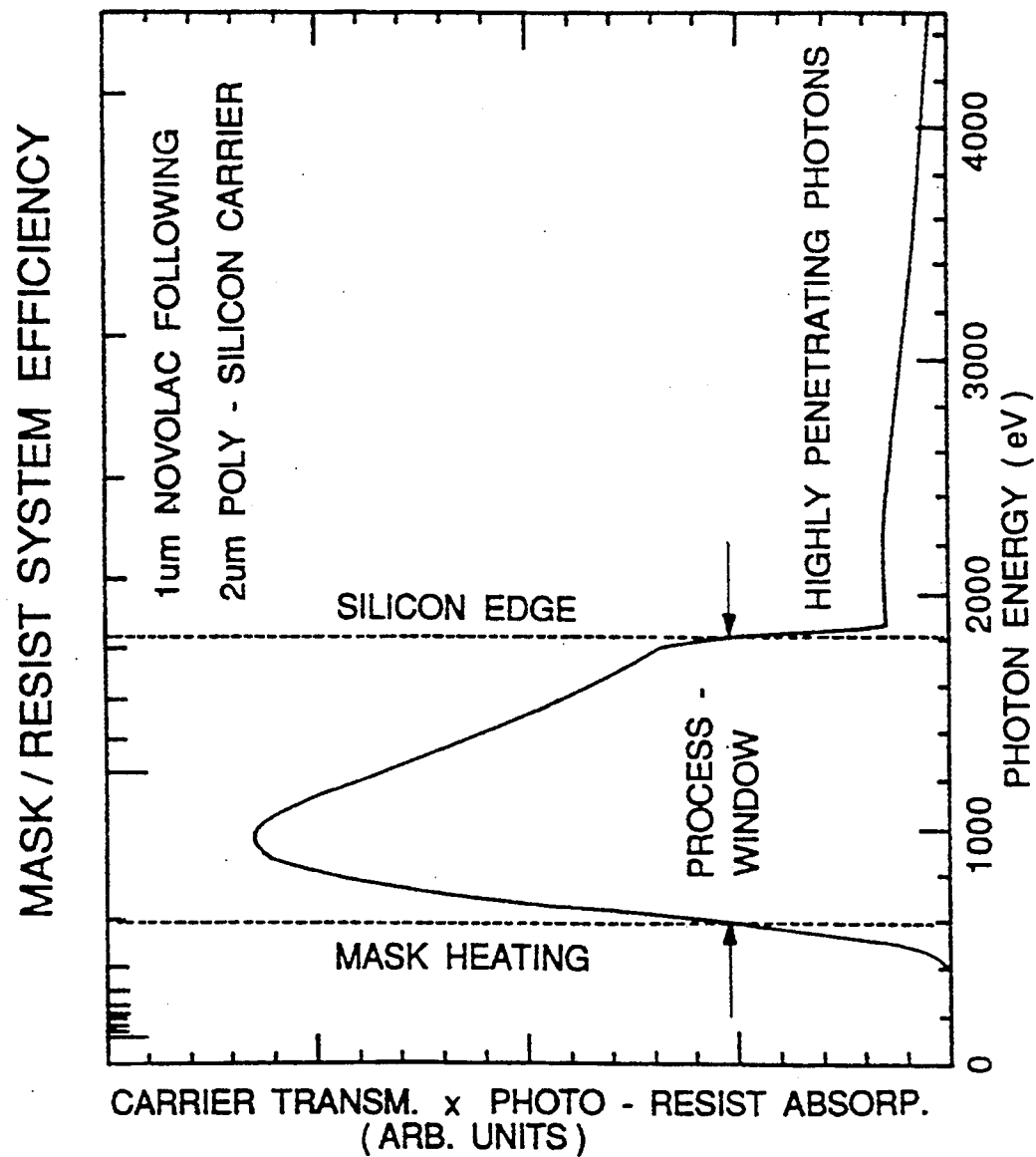
FIG. 4 is an illustrative graph showing an exemplary system response for a typical X-ray mask and photoresist, and which illustrates a preferred Process Window of photon energies.
Figure 7:
FIG. 7 is a top view of imaging performed by a mirror in accordance with the invention.
Figure 8:
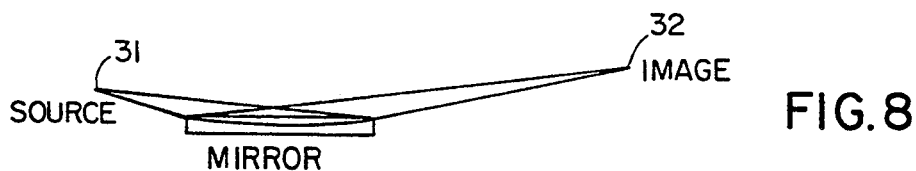
FIG. 8 is a side view of imaging performed by a mirror in accordance with the invention.

FIGS. 7 and 8 are top and side views, respectively, of the imaging performed by mirror 102. The high energy electrons orbiting in the synchrotron ring emit broadband X-rays as they are bent by the magnetic field. A fan of X-rays 22, FIG. 2, are emitted tangent to the path of the electrons 21. The synchrotron X-ray source typically has a horizontal divergence of 35 milli-radians and a vertical divergence of 1 milli-radian. The beamline should be capable of accepting all the vertical radiation and as large a horizontal fan as the bending magnets allow. Condensing mirror 102 collects the X-ray radiation from the synchrotron source. The chosen horizontal collection angle is 30 milli-radians, and the vertical collection angle is 2 milli-radians. The distance from source 31 to the center of mirror 102 is 2.5 meters. The distance from image 32 to the center of mirror 102 is 10 meters. The incident angle is 88 degrees to normal of the mirror.

The function of a condenser mirror is to focus the synchrotron radiation beam vertically while imaging horizontally to a line, in a non-stigmatic imaging system. The mirror must have different focusing power along two directions. Spherical surfaces have the same curvature along any direction, and thus do not provide enough freedom. Toroidal and elliptical surfaces can have different focusing power along two orthogonal directions. For instance, the equation for a torus as expressed in Cartesian coordinates is $$x^2 + [(y^2+z^2)^{\frac{1}{2}} - (R-r)]^2 = r^2 \qquad (1)$$

where R and r are radius of curvature along major and minor axes, respectively. R and r are the only variables which are determined by the horizontal collimating and vertical focusing condition. However, at grazing incidence conditions the off-axis aberrations cause the line image to be strongly curved, i.e. bent. That is, the imaging property varies with aperture. Unless the curvature of the surface is varied with aperture as well, there is no freedom to correct these unwanted aberrations.

Because of the small size of electron trajectory, the synchrotron radiation source acts as a point source. The present invention utilizes a single surface to correct aberrations, which surface is aspherical, and has symmetry only about a plane, without axial symmetry.

Figure 9:
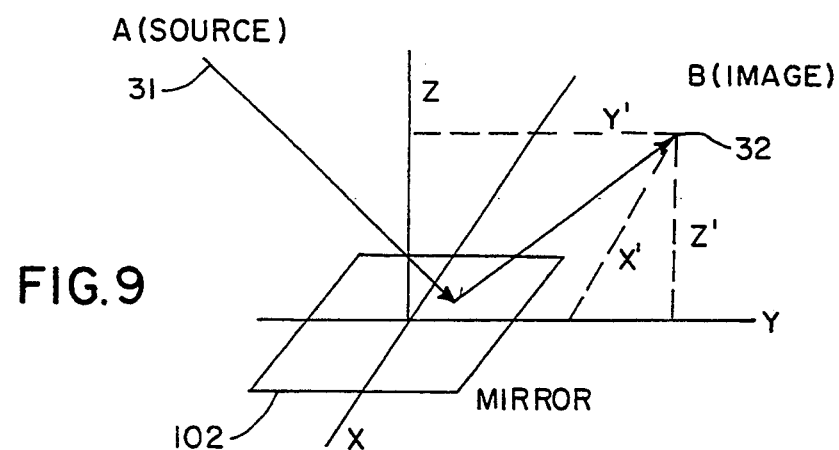
FIG. 9 shows optical geometry coordinates.

X-ray source 31 emits X-rays along a y axis, FIG. 9, and diverging along x and z axes. The x, y and z axes are orthogonal to each other. Mirror 102 has a reflecting surface asymmetrical about the y axis and having different focusing power in directions along the x and z axes in an imaging plane orthogonal to the y axis and spaced from the mirror along the y axis such that the mirror reflects and focuses the X-ray beam to a point along the y axis in the imaging plane and to a line, FIG. 7, along the x axis in the imaging plane.

Figure 10:
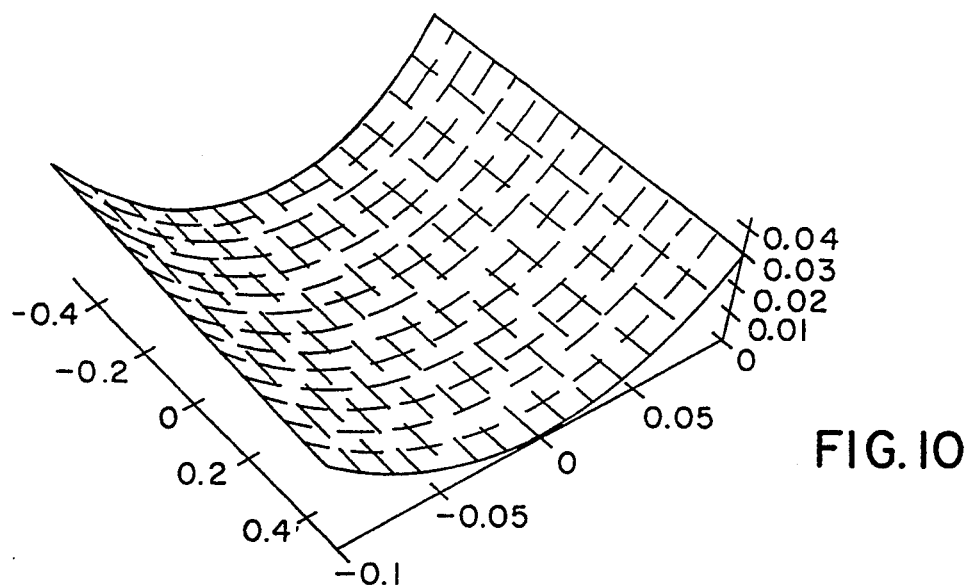
FIG. 10 is a perspective view of a mirror reflecting surface in accordance with the invention.

The reflecting surface of condenser mirror 102 is generated numerically. The optical path function F from source A to image B is determined by determining the optical path function from source A to the mirror P, and from the mirror P to the image B, according to $$F = AP + PB = ((x_A-x)^2 + (y_A-y)^2 + (z_A-z)^2)^{\frac{1}{2}} + ((x_B-x)^2 + (y_B-y)^2 + (z_B-z)^2)^{\frac{1}{2}}$$

where $x_A$ is the position of the source A along the x axis, $y_A$ is the position of the source along the y axis, $z_A$ is the position of the source along the z axis, $x_B$ is the position of the image along the x axis, $y_B$ is the position of the image along the y axis, $z_B$ is the position of the image along the z axis, x is the position on the mirror along the x axis, y is the position on the mirror along the y axis, and z is the position on the mirror along the z axis, such that $A(x_A, y_A, z_A)$ is the source position, $B(x_B, y_B, z_B)$ is the image position, and $P(x, y, z)$ is the position on the mirror. The partial derivatives of the optical path function F, $\partial F/\partial x$, $\partial F/\partial y$, $\partial F/\partial z$, have the significance of angles. The displacement of reflected rays from the image line along the x axis is zero, $\Delta x = 0$, if $\partial F/\partial x = 0$. The displacement of reflected rays from the image line along the y axis is zero, $\Delta y = 0$, if $\partial F/\partial y = 0$. The displacement of reflected rays from the image line along the z axis is zero, $\Delta z = 0$, if $\partial F/\partial z = 0$. A computational mesh or grid is set up on the reflecting surface having a plurality of grid points, and, upon determining the noted partial derivatives, the slope at the grid points is modified such that the displacement of the reflected rays from the image line vanishes. This tends to make the mirror surface discontinuous. The discontinuities are eliminated by varying surface conditions in z to smooth the surface. The surface is modified recursively until it provides a smooth line image in the image plane along the x axis. The surface is modified recursively according to $$z(x,y) = \sum_{i=1}^{n} \sum_{j=1}^{n} c_{ij} x^i y^j \qquad (3)$$

where n is the polynomial order, and c is the coefficient of the polynomials. The higher the order, the better the quality, though with the finite size of the mirror, very high orders are usually not necessary. FIG. 10 shows one preferred surface, where the units along the axes are in meters.

Figure 12:
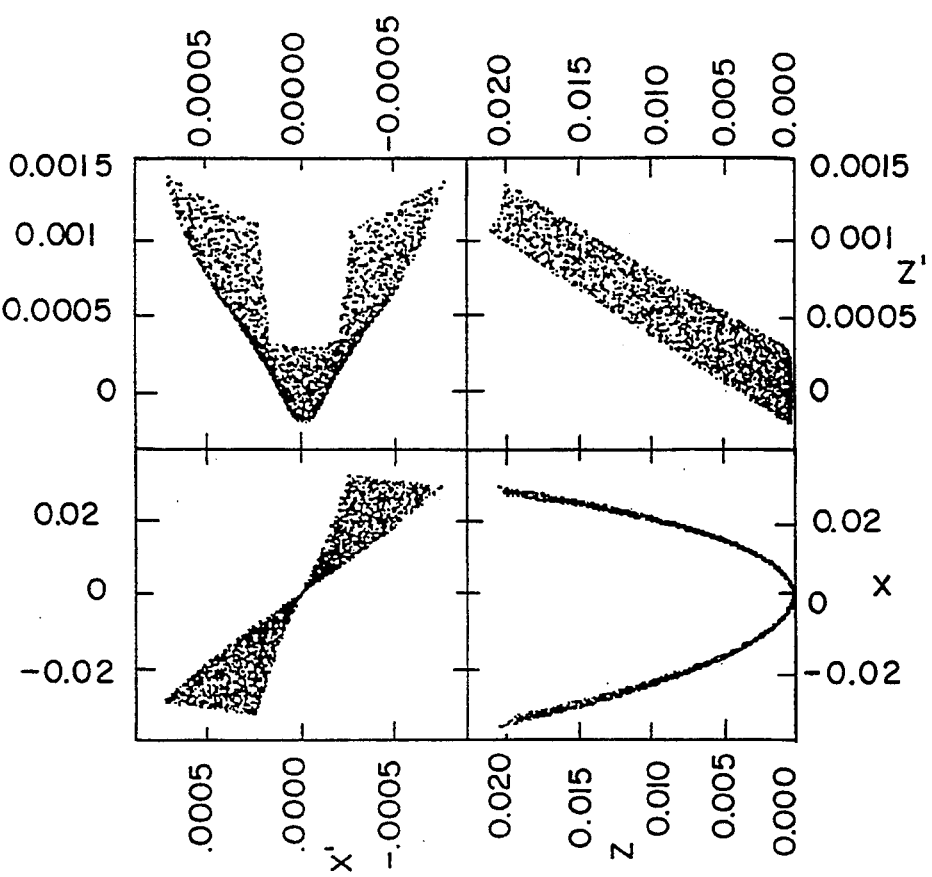
FIGS. 11 and 12 are ray tracing plots using SHADOW.
Figure 11:
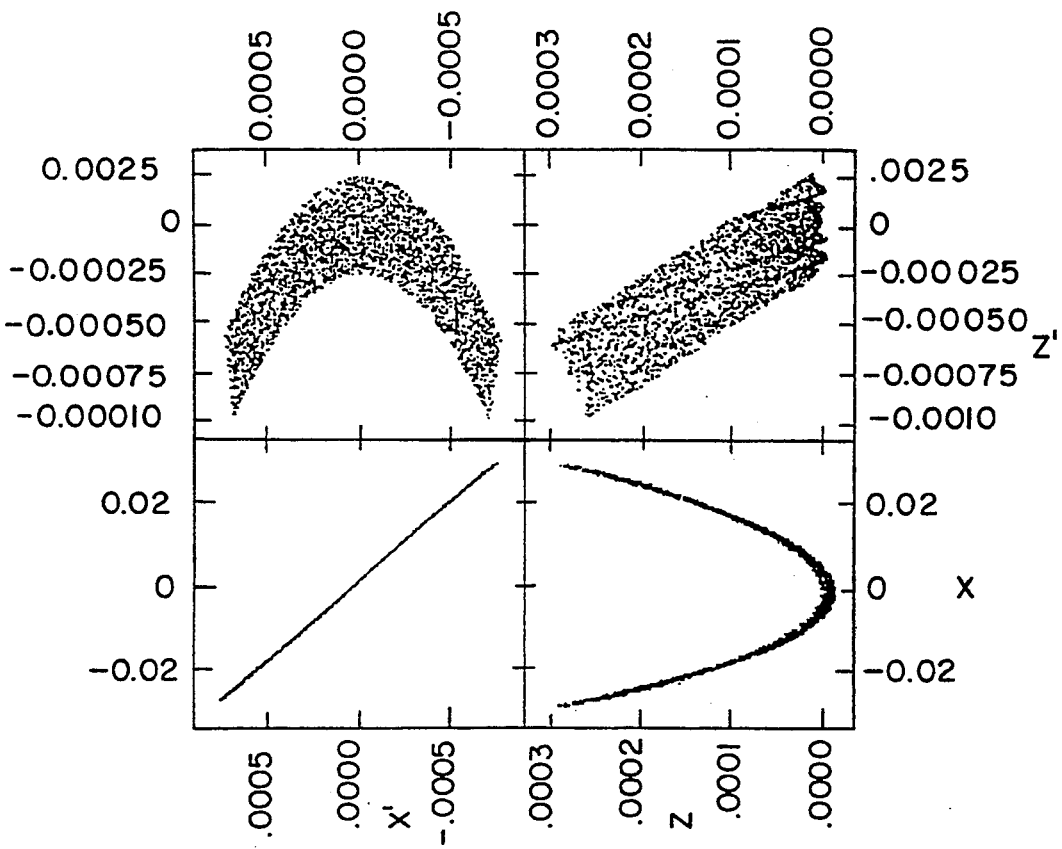

FIG. 11 shows ray tracing (units in meters) for the mirror of FIG. 10, using the "SHADOW" ray tracing program noted in incorporated U.S. Pat. No. 5,031,199. FIG. 12 shows ray tracing (units in meters) for an unmodified toroidal mirror with major radius R = 114.6 meters and minor radius r = 0.168 meters. The lower left plot in FIGS. 11 and 12 is x versus z (image), the upper left plot is x versus x', the upper right plot is z' versus x', and the lower right plot is z' versus z, where x', y', z' are the components of the ray direction unit vector, called direction cosines, where $$(x')^2 + (y')^2 + (z')^2 = 1.$$

In the present embodiment, y' is close to 1, and x' and z' are small. The horizontal divergence of the ray is x', and the vertical divergence is z'. Of significance is the change of scale in z in FIGS. 11 and 12. The bending in the z direction is about seventy times smaller in FIG. 11 than in FIG. 12, i.e. only about 0.3 millimeters over a 60 millimeter field.

Figure 13:
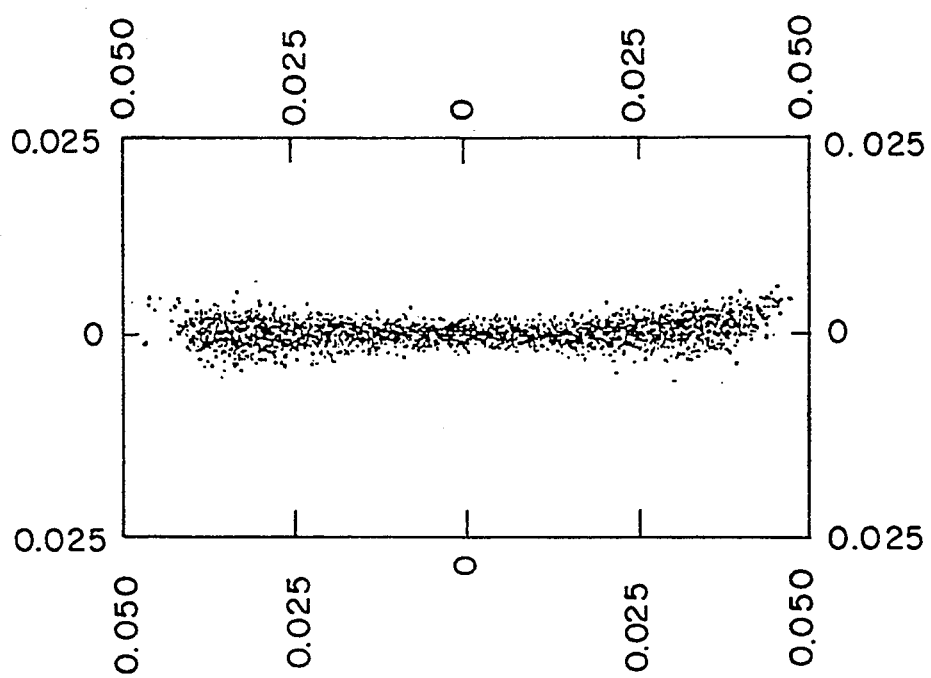
FIGS. 13 and 14 are ray tracing results using actual synchrotron radiation source parameters.

The above modeling is done assuming a point source. FIG. 13 shows the ray tracing result (units in meters) using actual synchrotron radiation source parameters, namely Aladdin at the University of Wisconsin, providing an X-ray lithography beamline image in the 25 millimeter by 50 millimeter exposure field. The image is fairly close to a horizontal line, which is the goal. This proves that the point source model is a good approximation.

In proximity lithography, the finite gap between the mask and wafer will cause an overlay error whenever the exposure beam has a variation in incident angle across the whole exposure field. In FIG. 11, the horizontal divergence dx is 1 milli-radian and it has a linear relationship with respect to horizontal position x, which causes a slight but linear displacement, i.e. "runout", which is about 10 nanometers for ±25 millimeter wide field and a 20 micrometer gap. Vertical divergence dz causes a distortion of 15 nanometers at the edge of the field. There is also image blur of 0.5 milli-radians.

Figure 14:
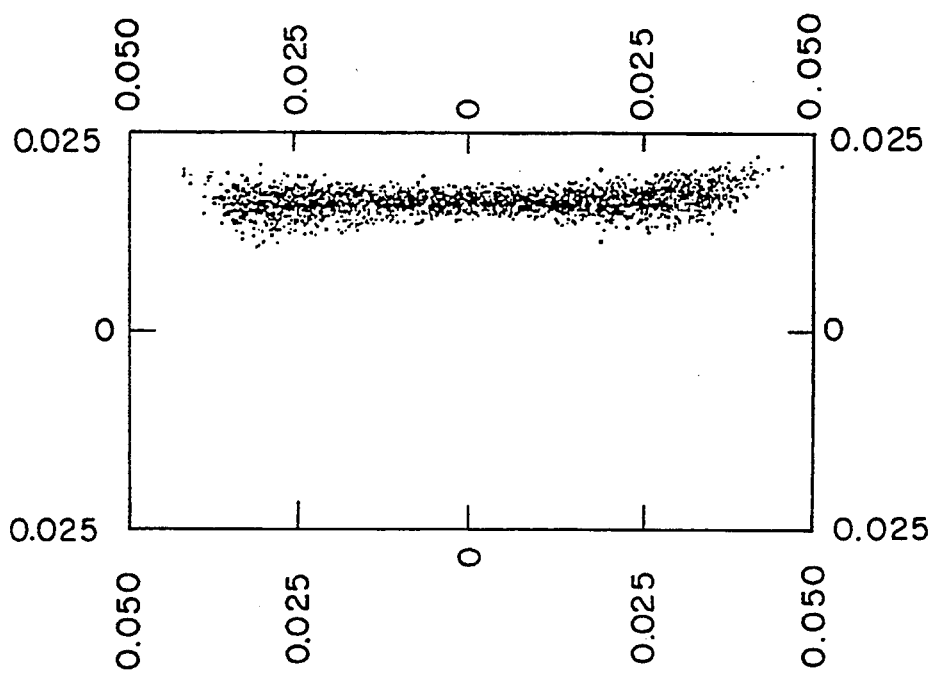

Exposure is accomplished by scanning the line shape X-ray beam over the range of the wafer, preferably by oscillating mirror 102, FIG. 6. The horizontal intensity distribution in the image produced by mirror 102 should not change with scanning. The change in overall reflectivity can be easily compensated by tuning the scanning speed. For a mirror exposure stage distance of 10 meters, to pattern a one inch wafer, the scanning angle is ±1.3 milliradians. Thus, the vibrating range of the mirror is ±0.65 milliradians. Mirror 102 provides a uniform exposure X-ray beam within this scan range, as shown in FIG. 14 (units in meters) which shows the image shape at the marginal scanning position corresponding to the 25 millimeter vertical field of FIG. 13. At the marginal scanning position, the image keeps the same shape and the vertical divergence is only shifted by 1.3 milliradians, which corresponds to a 26 nanometer "runout" at the edge of a 1 inch vertical field for the same 20 micrometer gap.

Figure 15:
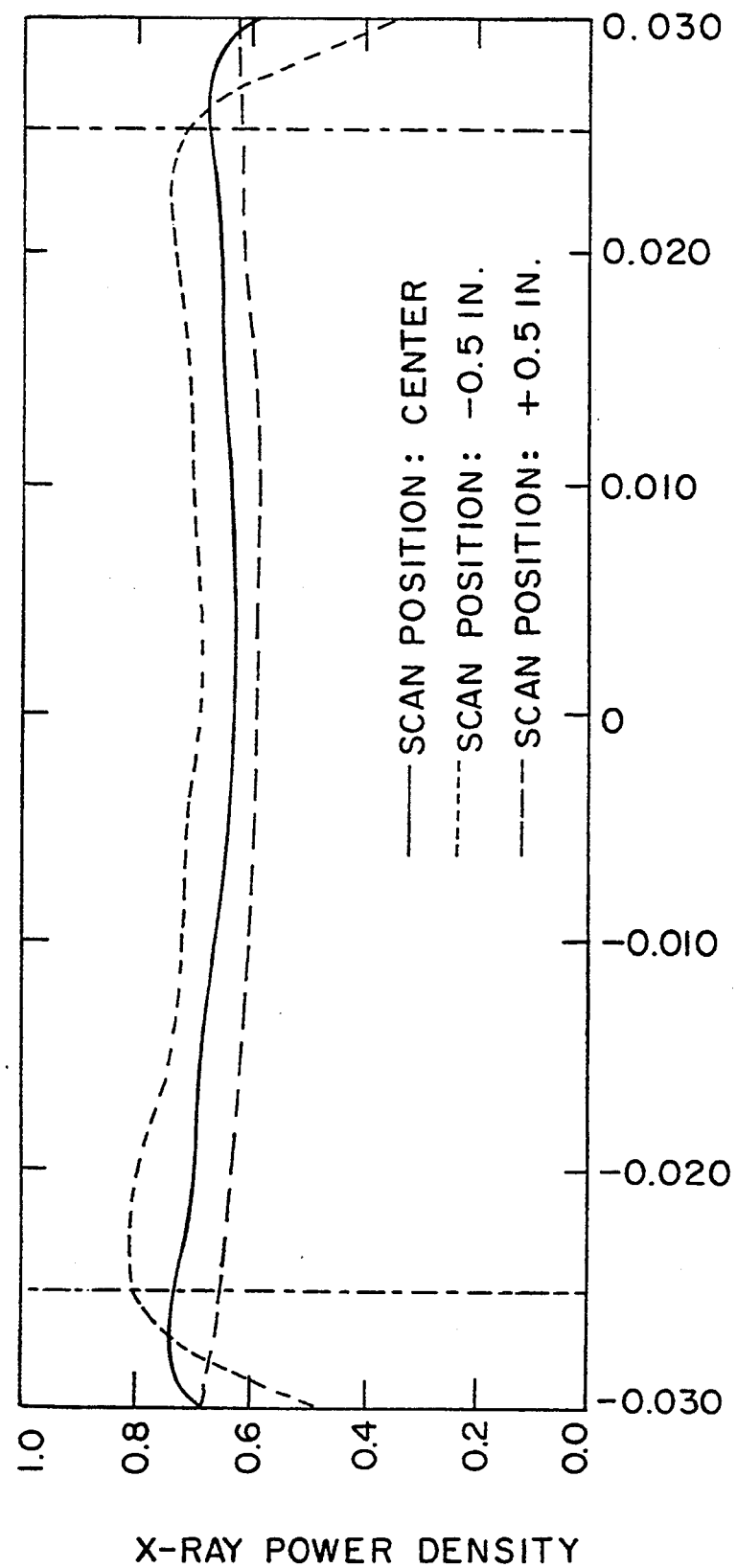
FIG. 15 is a graph showing X-ray power density versus horizontal image width.

FIG. 15 shows X-ray power density in arbitrary units versus horizontal image width in meters, and illustrates power density uniformity of the condenser mirror. There is less than a 4 percent variation in power density across the 1 inch scanning range. This is an improvement over multiple mirror systems. The change of X-ray power between different scan positions can be easily corrected by adjusting the speed of scanning, if desired.

Figure 17:
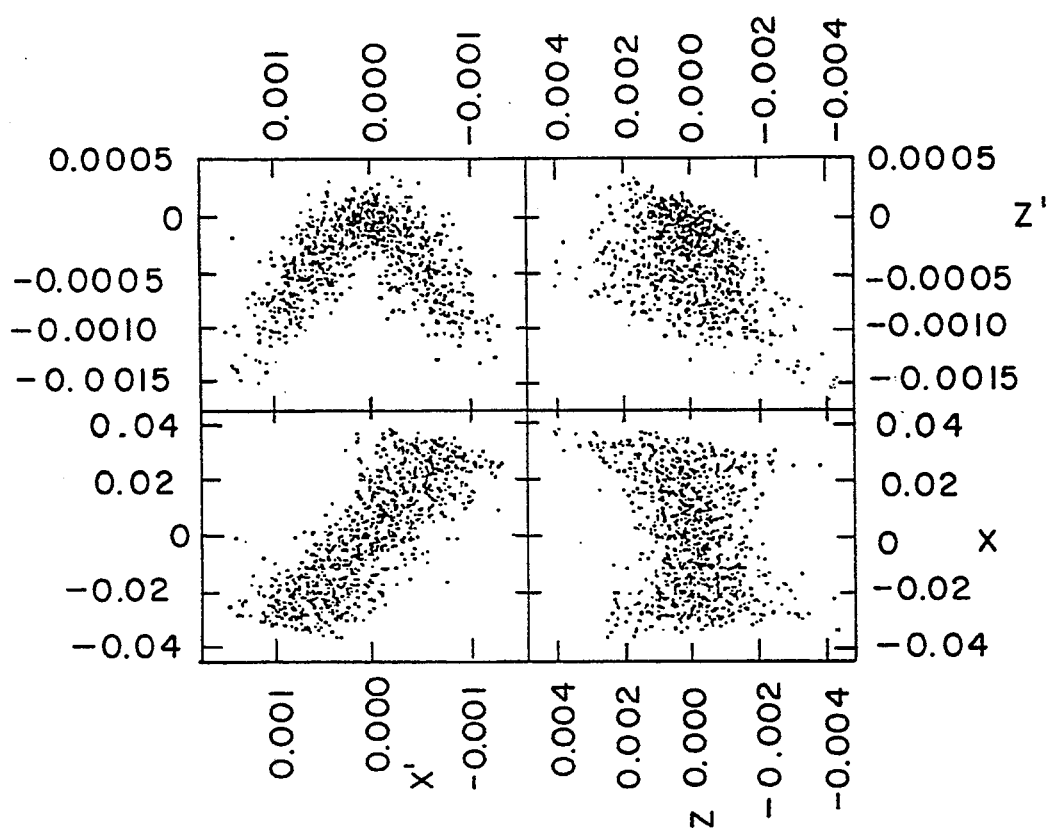
FIGS. 16 and 17 are ray tracing plots using the synchrotron source.
Figure 16:
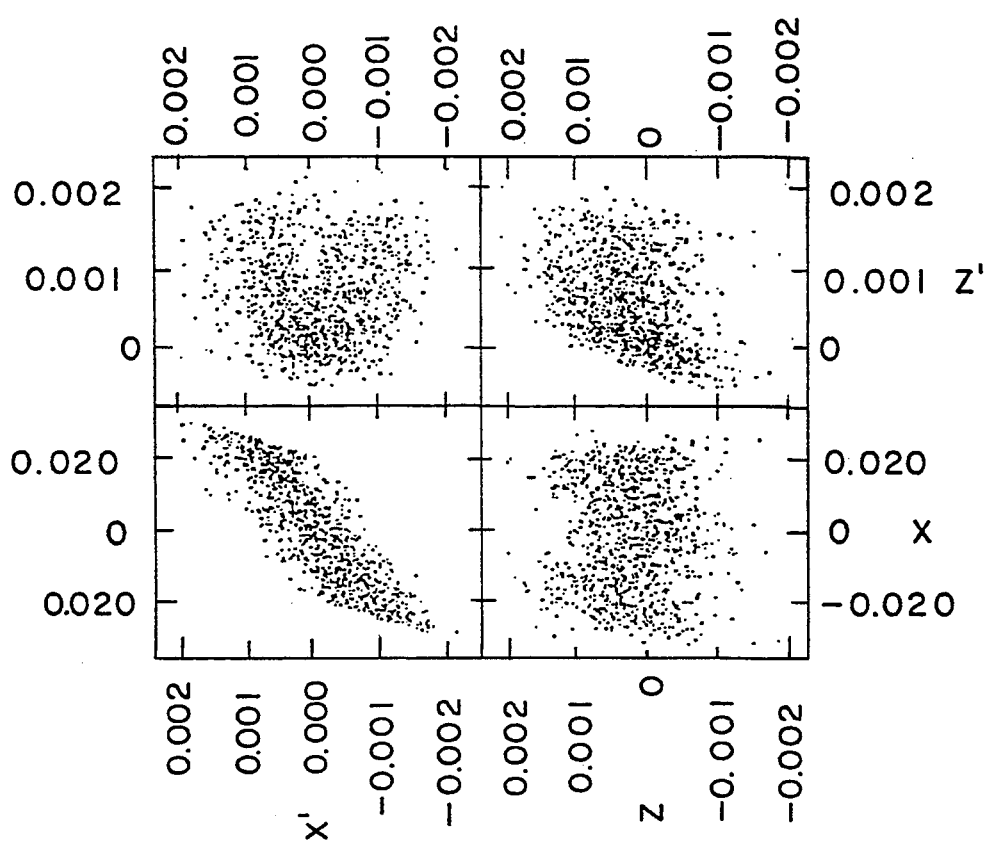

FIG. 16 shows ray tracing plots (units in meters) for the two mirror system of incorporated U.S. Pat. No. 5,031,199, and FIG. 17 shows the plot (units in meters) for the single aspherical mirror of the present invention, using the synchrotron source. The ray tracings show that the image characteristics are comparable. The horizontal and vertical divergences are smaller in FIG. 17 than FIG. 16, though the focus is widened by a small amount due to the finite size of the synchrotron source. Condenser mirror 102 forms a focus line 50 millimeters long with only 0.3 millimeter bending, which is 70 times less than the bending produced by a single toroidal mirror. The condenser mirror produces uniform exposure over a 50 millimeter field ±4 percent, which is comparable to the two mirror system of incorporated U.S. Pat. No. 5,031,199. The loss of X-ray flux for the present single aspherical mirror is only half that of the two mirror system.

As in incorporated U.S. Pat. No. 5,031,199, small corrections in power non-uniformity can be compensated by using thin filters with tapered thickness profiles for the exit window. Corrections that rely on the absorptive characteristics of various thicknesses of filters will have an impact on the shape of the transmitted spectrum. Thus, starting with an optical system that delivers an extremely uniform power distribution and spectral response, as does both the two mirror system of incorporated U.S. Pat. No. 5,031,199 and the single aspherical mirror system of the present invention, carries with it less need to clean up the image afterwards.

As noted, correcting the residual non-uniformities in the power at the image can be accomplished using filters or windows with tailored thickness profiles. As long as the required tailoring is slight, the attenuation produced will not affect the transmitted spectra. The procedure requires first mapping the power-density at the exposure-field. This can be accomplished by rastering any suitable detector across the exposure field. Knowing that the attenuation produced by an absorbing material is related to the thickness of the material by $I=I_o(e^{-\gamma t})$, on can easily calculate the additional absorber thickness required to attenuate the beam to the desired intensity, I. The analysis then provides an 'additional thickness' map. Various techniques are commonly employed during vacuum deposition to provide coatings with varying thickness profiles; such techniques can be as simple as positioning one part of the substrate closer to the source than the other, or as elaborate as utilizing a planetary motion system and a series of baffles.

Figure 18:
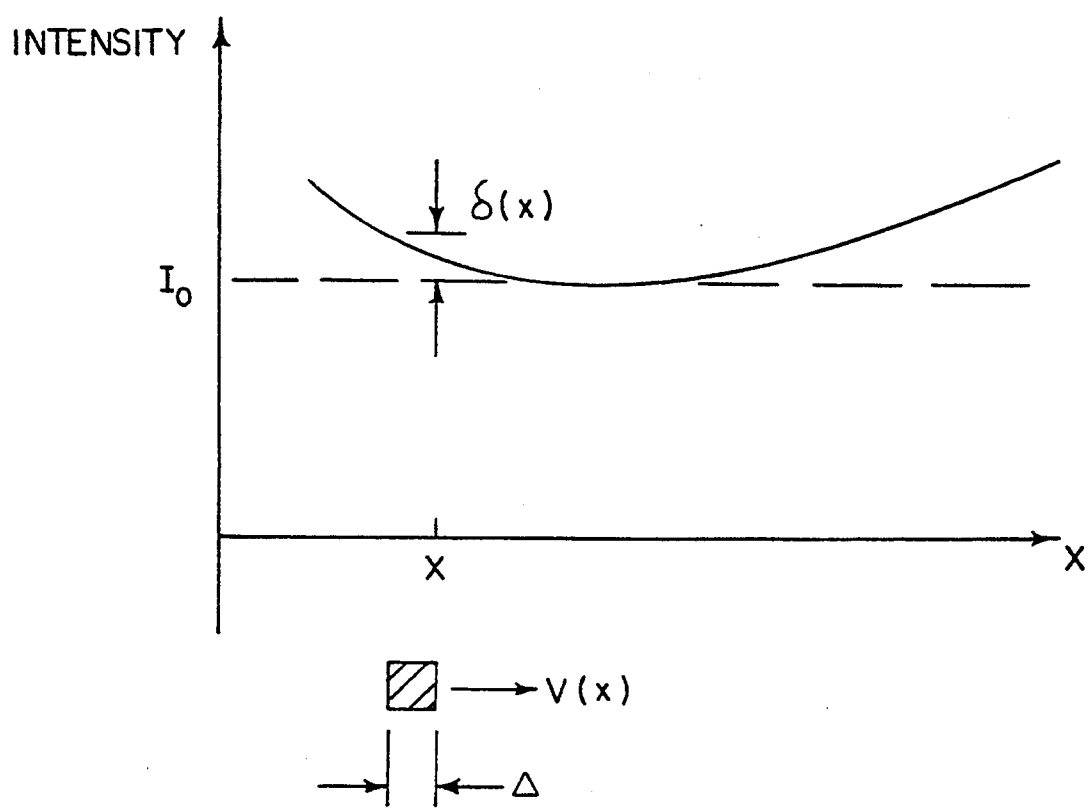
FIG. 18 is a graph illustrating a further embodiment.

Another approach to improve the uniformity in the horizontal direction is to use a scanning thin wire mesh positioned vertically across the beam. A feedback system can be used to monitor the X-ray intensity at the wire (e.g. by measuring the photo-current) and used to control the wire scanning speed (V(x)) according to the equation:

$$V(x) = \frac{2\Delta}{T_o}\left(1 + \frac{I_o}{\delta(x)}\right)$$

where $\Delta$ is the width of the wire, $T_o$ is the scanning time period, $I_o$ is the current intensity, and $\delta(x)$ is the intensity variation added to $I_o$, FIG. 18. In this way a beam of high uniformity can be delivered.

It is recognized that various equivalents, alternatives and modifications are possible within the scope of the appended claims.

We claim:

1. A method for imaging an X-ray lithography beamline from an X-ray source emitting an X-ray beam along a y axis and diverging along x and z axes, respectively, where the x, y and z axes are orthogonal to each other, comprising:

providing a mirror having a reflecting surface reflecting the X-ray beam to an imaging plane orthogonal to the y axis and spaced from the mirror along the y axis;

determining the optical path function F from the source A to the image B by determining the optical path function from the source A to the mirror P, and from the mirror P to the image B, according to $$F=AP+PB=((x_A-x)^2+(y_A-y)^2+(z_A-z)^2)^{\frac{1}{2}}+((x_B-x)^2+(y_B-y)^2+(z_B-z)^2)^{\frac{1}{2}}$$

where $x_A$ is the position of the source A along the x axis, $y_A$ is the position of the source along the y axis, $z_A$ is the position of the source along the z axis, $x_B$ is the position of the image along the x axis, $y_B$ is the position of the image along the y axis, $z_B$ is the position of the image along the z axis, x is the position on the mirror along the x axis, y is the position on the mirror along the y axis, and z is the position on the mirror along the z axis, such that $A(x_A, y_A, z_A)$ is the source position, $B(x_B, y_B, z_B)$ is the image position, and $P(x, y, z)$ is the position on the mirror;

determining the partial derivatives of the optical path function F, $\partial F/\partial x$, $\partial F/\partial y$, $\partial F/\partial z$, wherein the displacement of reflected rays from the image line along the x axis is zero, $\Delta x=0$, if $\partial F/\partial x=0$, the displacement of reflected rays from the image line along the y axis is zero, $\Delta y=0$, if $\partial F/\partial y=0$, and the displacement of reflected rays from the image line along the z axis is zero, $\Delta z=0$, if $\partial F/\partial z=0$;

determining a grid on said reflecting surface comprising a plurality of grid points; and modifying the slope at said grid points such that the displacement of the reflected rays from the image line vanishes.

2. The method according to claim 1 comprising eliminating discontinuities in said reflecting surface by varying surface coordinates in z to smooth the surface.

3. The method according to claim 2 comprising modifying the surface recursively until it provides a smooth line image in the image plane along the x axis.

4. The method according to claim 3 comprising modifying the surface recursively according to $$z(x,y) = \sum_{i=1}^{n} \sum_{j=1}^{n} c_{ij} x^i y^j$$

where n is the polynomial order, and c is the coefficient of the polynomials.

* * * * *

UNITED STATES PATENT AND TRADEMARK OFFICE
CERTIFICATE OF CORRECTION

PATENT NO. : 5,371,774
DATED : December 6, 1994
INVENTOR(S) : FRANCO CERRINA ET AL It is certified that error appears in the above-identified patent and that said Letters Patent is hereby corrected as shown below:

Title page, item

[75] Inventors: delete "Jaibei" and substitute therefor -- Jiabei --; Other Publications: delete "69(7)" and substitute therefor -- 60(7) --

Col. 7, Lines 17-18, delete

"$F=AP+PB=((x_A-x)^2+(y_A-y)^2+(z_A-z)^2)^{1/2}+((x_B-x)^2+(y_B-y)^2+(z_B-z)^2)^{1/2}$"

and substitute therefor

--$F=AP+PB=((x_A-x)^2+(y_A-y)^2+(z_A-z)^2)^{1/2}+((x_B-x)^2+(y_B-y)^2+(z_B-z)^2)^{1/2}$--

UNITED STATES PATENT AND TRADEMARK OFFICE
CERTIFICATE OF CORRECTION

PATENT NO. : 5,371,774
DATED : December 6, 1994
INVENTOR(S) : FRANCO CERRINA ET AL It is certified that error appears in the above-identified patent and that said Letters Patent is hereby corrected as shown below:

Claim 1, Col. 10, Lines 19-20, delete

"$F=AP+PB=((x_A-x)^2+(y_A-y)^2+(z_A-z)^2)^{1/2}+((x_B-x)^2+(y_B-y)^2+(z_B-z)^2)^{1/2}$"

and substitute therefor

--$F=AP+PB=((x_A-x)^2+(y_A-y)^2+(z_A-z)^2)^{1/2}+((x_B-x)^2+(y_B-y)^2+(z_B-z)^2)^{1/2}$--

Signed and Sealed this

Seventh Day of March, 1995

*Attest:*

BRUCE LEHMAN

*Attesting Officer*     *Commissioner of Patents and Trademarks*